_United States Patent_ [19]

Hermstein et al.

[11] 3,938,039
[45] Feb. 10, 1976

[54] VOLTAGE MEASURING DEVICE FOR ENCAPSULATED HIGH-VOLTAGE INSTALLATIONS

[75] Inventors: Wolfgang Hermstein, Nurnberg; Gerhard Rosenberger; Willi Müller, both of Berlin, all of Germany

[73] Assignee: Siemens Aktiengesellschaft, Munich, Germany

[22] Filed: Aug. 8, 1974

[21] Appl. No.: 495,839

[30] Foreign Application Priority Data
Aug. 10, 1973  Germany............................ 2341074

[52] U.S. Cl. .................... 324/96; 324/97; 350/150; 356/114
[51] Int. Cl.² ......................................... G01R 31/00
[58] Field of Search .......... 324/95, 96, 97; 350/150, 350/151; 356/117, 114

[56] References Cited
UNITED STATES PATENTS

| | | | |
|---|---|---|---|
| 3,543,151 | 11/1970 | Pelenc | 324/96 |
| 3,581,202 | 5/1971 | Pelenc | 324/96 |
| 3,629,703 | 12/1971 | Bernard | 324/96 |
| 3,675,125 | 7/1972 | Jaecklin | 324/96 |
| 3,746,983 | 7/1973 | Renz | 324/96 |
| 3,810,013 | 3/1974 | Muller | 324/96 |

*Primary Examiner*—Saxfield Chatmon, Jr.
*Attorney, Agent, or Firm*—Kenyon & Kenyon Reilly Carr & Chapin

[57] ABSTRACT

A voltage measuring device is described which is suitable for application to encapsulated, high-voltage switching installations which include an inner conductor surrounded by a grounded metallic outer tube. The device utilizes the fact that an electric field exists between the inner conductor and metallic outer tube. It includes means for widening a portion of the outer tube to thereby form a space for locating certain portions of the measuring device. The device itself includes an electro-optical component, such as a Kerr or Pockels cell which is positioned in the space defined by the widening means, at a distance from the inner conductor which is approximately equal to the distance that the outer tube is located from said inner conductor. A metal layer is positioned on that side of the electro-optical component which is away from the inner conductor. The metal layer is electrically connected to the grounded, metallic outer tube. The presence of the layer insures that the lines of the electric field between the inner conductor and the outer tube are directed through the electrooptical component, perpendicular to the metal layer. A source of polarized light is directed towards said electro-optical component. As the light passes through the cell the plane of polarization of the light is rotated as a function of the electric field intensity. Thus the exiting light becomes a measure of the voltage between the inner conductor and the outer tube. The shifted, polarized light exiting from the electro-optical component is then processed by an optical evaluation device which produces an electrical output proportional to the amount of shift of the plane of polarization of the light.

11 Claims, 3 Drawing Figures

VOLTAGE MEASURING DEVICE FOR ENCAPSULATED HIGH-VOLTAGE INSTALLATIONS

BACKGROUND OF THE INVENTION

1. Field of the Invention

This invention pertains to voltage measuring devices for high-voltage installations, and particularly to voltage measuring devices employing electro-optical detection components.

2. Description of the Prior Art

Apparatus useful in measuring the voltage in an encapsulated high-voltage installation are described in United States patent application, Ser. No. 495,820, filed Aug. 8, 1974 and assigned to the same assignee as the present application. In general, the apparatus disclosed therein includes a capacitive voltage divider arrangement wherein the low voltage leg of the capacitor network is monitored by various devices to thereby give a reading which is proportional to the voltage between the inner conductor and the outer tube. Certain of the measuring devices described in the aforementioned application include electro-optical components such as the Kerr cell and the Pockels cell. The voltage developed across the "low voltage" capacitor of the capacitor voltage divider bridge is supplied to the electro-optical component with the result that the plane of polarization of polarized light entering the electro-optical component is shifted in proportion to said voltage.

Another utilization of an electro-optical component as a means for measuring voltage in such installations is described in German Offenlegungsschrift 2,130,046. Therein is described an electro-optical component which consists of an optical wave guide which is wound into a toroidal coil. The toroidal coil is mounted in a ring-shaped widening of the outer tube of the high-voltage installation. Since optical wave guides are relatively expensive, being more so when the latter are wound in toroidal coil form, the known device is a costly item to manufacture.

Further, it is known in the art that a Kerr of Pockels cell can be employed for the measurement of voltage, utilizing the electric field intensity (see the journal entitled "Elecktrie," vol. 22 (1968, No. 7, pages 261–266). However, this article does not indicate how an arrangement of a Kerr or Pockels cell can be employed in the extension of an outer tube of a high-voltage installation without adversely affecting the field pattern of the electric field between the inner conductor and the outer tube.

It is therefore a primary object of the invention to provide a measuring device for such high-voltage installations which can be manufactured at a relatively low cost.

It is a further object of this invention to provide a measuring device which employs electro-optical components positioned in the electric field between the conductors without adversely affecting the field lines.

It is another object of this invention, to employ electro-optical components in such a manner that the additional space required to house such components is kept to a minimum.

SUMMARY OF THE INVENTION

A voltage measuring device is described which is suitable for application to encapsulated, high-voltage switching installations which include an inner conductor surrounded by a grounded metallic outer tube. The device utilizes the fact that an electric field exists between the inner conductor and metallic outer tube. It includes means for widening a portion of the outer tube to thereby form a space for locating certain portions of the measuring device. The device itself includes an electro-optical component, such as a Kerr or Pockels cell which is positioned in the space defined by the widening means, at a distance from the inner conductor which is approximately equal to the distance that the outer tube is located from said inner conductor. A metal layer is positioned on that side of the electro-optical component which is away from the inner conductor. The metal layer is electrically connected to the grounded, metallic outer tube. The presence of the layer insures that the lines of the electric field between the inner conductor and the outer tube are directed through the electro-optical component, perpendicular to the metal layer. A source of polarized light is directed towards said electro-optical component, perpendicular to the metal layer. As the light passes through the cell the plane of polarization of the light is rotated as a function of the electric field intensity. Thus the exiting light becomes a measure of the voltage between the inner conductor and the outer tube. The shifted, polarized light exiting from the electro-optical component is then processed by an optical evaluation device which produces an electrical output proportional to the amount of shift of the plane of polarization of the light.

The widening means in the preferred embodiment would include a metallic stub positioned in the outer tube and further includes a metal flange which seals the space defined by the stub from the outside. Where there is sufficient room, the electro-optical component, the source of polarized light and the optical evaluation device can all be placed within the space defined by the widening means. In that instance, the appropriate feedthroughs are needed to supply the electrical output from the evaluation device to monitoring equipment outside.

An alternate embodiment, for those situations where the space is a minimum, provides for the positioning of the polarized light source and optical evaluation device outside the space with suitable entrance and exit windows into the space area.

BRIEF DESCRIPTION OF THE DRAWINGS

Reference is now made to the accompanying drawings for a better understanding of the nature and objects of the invention. The drawings illustrate the best mode presently contemplated for carrying out the objects of the invention and its principles, and are not to be construed as restrictions or limitations on its scope. In the drawings.

DESCRIPTION OF THE PREFERRED EMBODIMENTS

Figure 1:
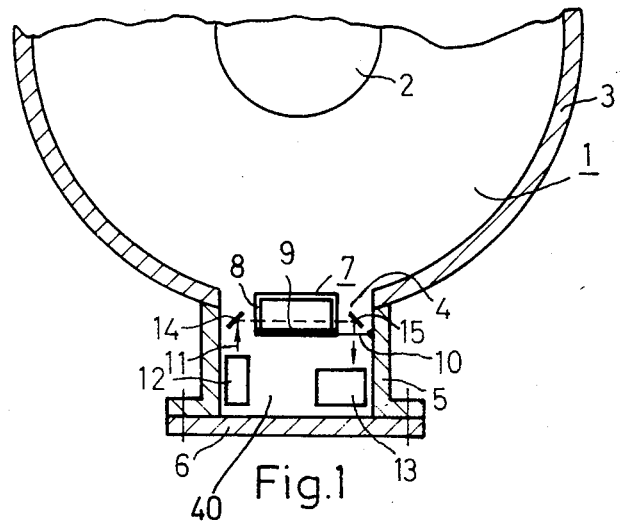
FIG. 1 depicts in schematic, elevational, sectional view, and embodiment of the present invention employing a Kerr cell.

A typical high-voltage switching installation 1, comprises an inner conductor 2 and an outer tube 3. For the purposes of this invention, the outer tube 3 is provided with a means for widening the tube, 4. The widening means defines a space 40 into which the parts of the measuring device may be included. In the preferred embodiments, the widening means or extension 4 can be formed by a stub 5, which may be attached to the outer wall of the tube 3 by suitable welding techniques such that the metallic portions of the stub 5 are electrically integral with the outer tube 3. Attached to a flanged portion of the stub 5 is an end plate or flange 6 which seals off the space 40 from the outside.

Positioned in the space 40, at a distance from the inner tube 2 which is approximately equal to the distance from the tube 2 to the outer tube 3 is an electro-optical component 7. In the embodiment of FIG. 1, such an electro-optical component would be the so-called Kerr cell, well known in the art. The cell is shown schematically and includes a housing 8 manufactured from a non-conductive, light-transparent insulating material. On the side facing away from the inner conductor 2, there is positioned a metal layer 9. This metal layer is electrically connected to the metallic stub 5 by a suitable lead 10. With this arrangement of cell and metal layer, on the one hand, the electric field between the inner conductor group 2 is not interfered with by the presence of the Kerr cell in the space 40. Further, since the metal layer 9 is grounded through the metal stub 5 connected to the grounded metallic outer tube, the electric field lines through the Kerr cell 7 are maintained essentially perpendicular thereto and the metal layer 9.

Within the space 40 there is appropriately positioned a source of polarized light, 12. A suitable optical deflection device, such as a mirror, 14, directs the beam of polarized light, 11 towards the entrance opening of the Kerr cell 7. As the polarized light passes through the Kerr cell, the plane of polarization of the light is rotated by an amount which is proportional to the intensity of the electrical field passing through the cell. The optical deflection arrangement 14 insures that the polarized light entering the cell 7 is perpendicular to the lines of the electric field passing through the cell — a necessary condition if the shift in the plane of polarization of the light exiting from the cell is to be a true indication of the intensity of the field. A second deflection arrangement, 15 is positioned appropriately at the exit opening of the cell 7 thereby directing the emanating light to an evaluation device 13. The optical evaluation device 13 is characterized in that it provides an electrical output which is proportional to the amount of shift of the plane of polarization of the light having passed through the cell. Consequently, its output is thus proportional to the voltage between the inner conductor 2 and the outer tube 3. Appropriate feedthrough terminal can be located either in the stub wall 5 or the flange 6 which enable the electrical output produced by the evaluation device 13 to be supplied to various monitoring equipment external to the installation. Of course, if only a reading of the voltage were desired, i.e., a reading of the voltage output of the optical evaluation device 13, then a suitable volt meter could be positioned in space 40 and a window provided in the stub 5 to make ready readability of the meter.

Figure 2:
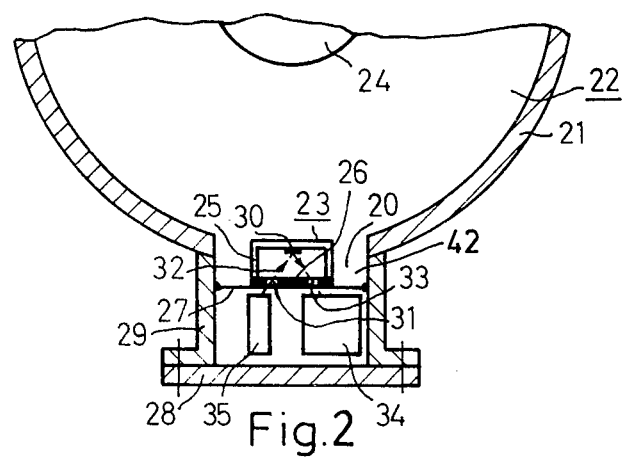
FIG. 2 is a similar view depicting the arrangement used when a Pockels cell is employed in the invention.

FIG. 2 shows a variation of the basic invention wherein a Pockels cell is employed as the electro-optical component. The cell 23 is positioned in a space 42 which is formed in the outer wall of the tube 21 by a metallic stub 29 and flange plate 28. As before, the cell 23 is positioned in the space 42 at a distance from the inner conductor 24 which is approximately equal to the distance between the conductor 24 and the outer tube 21. The cell 23 is encapsulated in an insulated housing 25. On the side facing away from the inner conductor, a metal layer 26 is positioned which is electrically connected via lead 27 to the stub 29 and thus to the grounded outer tube 21. The cell 23 includes within itself, on the side nearest the inner conductor 24, a mirror 30.

Positioned within the space 42 is a polarized light source 35 which directs polarized light 32 through an entrance window 31 appropriately located in the metal layer 26. The light is directed from the source through the window 31 into the cell 23 such that it is deflected by the mirror arrangement 30 back out of the cell and through an exit window 33 in the metal layer. The light exiting through the window, through the cell 23 and the window 33 is received by the evaluation device 34 which processes the polarized light in much the same manner as the device 13 in FIG. 1.

It should be noted that although the ray path of light 32 is shown entering the cell 23 at a considerable angle of incidence to the electric field lines (the latter passing through the Pockels cell 23 substantially perpendicular to the cell and the metal layer 26), it is to be understood that the optical deflection arrangement 30 is designed such that through multiple reflections within the cell 23 the entering rays are directed approximately parallel to the electric field lines. This is so in order to obtain, utilizing the Pockels effect, a rotation of the plane of polarization of the light in proportion to the field intensity within the cell 23. Thus, as a result, the rotating of the plane of polarization gives a measure of the voltage between the inner conductor 24 and the outer tube 21.

Figure 3:
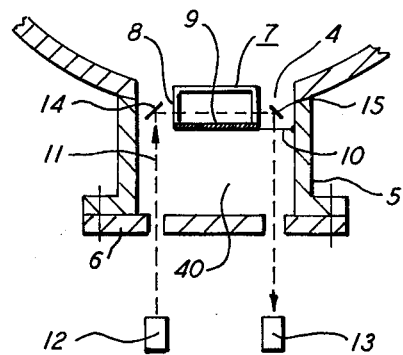
FIG. 3 is a schematic diagram showing how the light source and the evaluation device can be positioned outside of the stub accommodating the electro-optical component.

Other variations of the embodiments described above would be obvious to those skilled in the art. For example, where space limitations necessitate that the extensions formed by stubs 5 or 29 be kept to a minimum, the source of polarized light and/or the optical evaluation device (13, or 34) may be positioned outside of spaces 40 or 42. In that instance, suitable openings would have to be provided in the flanges 6 and 28 so that the polarized light exiting the light source or entering the optical evaluation device can find a passage to the electro-optical cells as shown, for example, in FIG. 3.

It is to be appreciated that the above are only preferred embodiments and are not to be construed as limitations on the breadth of the invention which shall be controlled by the scope of the claims appended hereto.

What is claimed is:

1. A voltage measuring device for use with an encapsulated, high-voltage switching installation including an inner conductor within a grounded metallic outer tube wherein an electric field exists between said inner conductor and said outer tube which comprises:

a. means for widening said outer tube to thereby form a space for locating at least one of the following elements of said measuring device;

b. a Kerr cell positioned, approximately, at a distance from said inner conductor equal to the distance said outer tube is located from said inner conductor, said Kerr cell positioned such that said electric field passes through said cell;

c. a source of polarized light, said polarized light directed towards said Kerr cell and passing therethrough;

d. a metal layer covering said Kerr cell on the side facing away from said inner conductor, said metal layer electrically connected to said outer tube; and e. an optical evaluation device for monitoring the polarized light exiting from said instrument, said evaluation device producing an indication proportional to the amount of shift of the plane of polarization of said light, the amount of said shifting being proportional to the intensity of said electric field.

2. The voltage measuring device of claim 1 where said Kerr cell, said source of polarized light and said optical evaluation device are all positioned within said space formed by said widening means.

3. The voltage measuring device of claim 1 where said light source and said evaluation device are positioned outside the space formed by said widening means, said widening means including an entrance and an exit window for routing the polarized light to and from said electro-optical components.

4. The voltage measuring device of claim 1 where said widening means comprises a metallic stub positioned in said outer tube and a metal flange, connected to said stub, to thereby seal said space from the outside.

5. A voltage measuring device for use with an encapsulated, high-voltage switching installation including an inner conductor within a grounded metallic outer tube wherein an electric field exists between said inner conductor and said outer tube which comprises:

a. means for widening said outer tube to thereby form a space for locating at least one of the following elements of said measuring device;

b. a Pockels cell positioned, approximately, at a distance from said inner conductor equal to the distance said outer tube is located from said inner conductor, said Pockels cell positioned such that said electric field passes through said cell;

c. a source of polarized light, said polarized light directed towards said Pockels cell and passing therethrough;

d. a metal layer covering said Pockels cell on the side facing away from said inner conductor, said metal layer electrically connected to said outer tube; and e. an optical evaluation device for monitoring the polarized light exiting from said instrument, said evaluation device producing an indication proportional to the amount of shift of the plane of polarization of said light, the amount of said shifting being proportional to the intensity of said electric field.

6. The voltage measuring device of claim 5 wherein said metal layer includes an entrance and an exit opening, said polarized light directed towards said component through said entrance opening, said Pockels cell including a mirror arrangement for directing said polarized light entering the cell, through said exit opening and towards said evaluation device.

7. The voltage measuring device of claim 5 where said Pockels cell, said source of polarized light and said optical evaluation device are all positioned within said space formed by said widening means.

8. The voltage measuring device of claim 5 where said light source and said evaluation device are positioned outside the space formed by said widening means, said widening means including an entrance and an exit window for routing the polarized light to and from said Pockels cell.

9. The voltage measuring device of claim 5 where said widening means comprises a metallic stub positioned in said outer tube and a metal flange, connected to said stub, to thereby seal said space from the outside.

10. A voltage measuring device for use with an encapsulated, high-voltage switching installation including an inner conductor within a grounded metallic outer tube wherein an electric field exists between said inner conductor and said outer tube which comprises: means for widening said outer tube to thereby form a space for locating at least one of the following elements of said measuring device; an electro-optical component positioned, approximately, at a distance from said inner conductor equal to the distance said outer tube is located from said inner conductor, said component positioned such that said electric field passes through said component; a source of polarized light, said polarized light directed towards said electro-optical component and passing therethrough; a metal layer covering said electro-optical component on the side facing away from said inner conductor, said metal layer electrically connected to said outer tube; and, an optical evaluation device for monitoring the polarized light exiting from said instrument, said evaluation device producing an indication proportional to the amount of shift of the plane of polarization of said light, the amount of said shifting being proportional to the intensity of said electric field, said electro-optical component, said source of polarized light and said optical evaluation device all being positioned within said space formed by said widening means.

11. A voltage measuring device for use with an encapsulated, high-voltage switching installation including an inner conductor within a grounded metallic outer tube wherein an electric field exists between said inner conductor and said outer tube which comprises: means for widening said outer tube to thereby form a space for locating at least one of the following elements of said measuring device; an electro-optical component positioned, approximately, at a distance from said inner conductor equal to the distance said outer tube is located from said inner conductor, said component positioned such that said electric field passes through said component; a source of polarized light, said polarized light directed towards said electro-optical component and passing therethrough; a metal layer covering said electro-optical component on the side facing away from said inner conductor, said metal layer electrically connected to said outer tube; and, an optical evaluation device for monitoring the polarized light exiting from said instrument, said evaluation device producing an indication proportional to the amount of shift of the plane of polarization of said light, the amount of said shifting being proportional to the intensity of said electric field, said widening means including a metallic stub positioned in said outer tube and a metal flange, connected to said stub, to thereby seal said space from the outside.

* * * * *